United States Patent [19]

Hammer

[11] Patent Number: 5,452,225
[45] Date of Patent: Sep. 19, 1995

[54] METHOD FOR DEFINING AND USING A TIMING MODEL FOR AN ELECTRONIC CIRCUIT

[75] Inventor: Mark E. Hammer, Loveland, Colo.

[73] Assignee: Hewlett-Packard Company, Palo Alto, Calif.

[21] Appl. No.: 185,641

[22] Filed: Jan. 24, 1994

[51] Int. Cl.⁶ .............................................. G06F 17/50
[52] U.S. Cl. .................... 364/488; 364/489; 364/578
[58] Field of Search ............... 364/488, 489, 490, 491, 364/578

[56] References Cited

U.S. PATENT DOCUMENTS

| | | | |
|---|---|---|---|
| 3,598,977 | 10/1968 | Clemmons | 364/488 |
| 4,907,180 | 3/1990 | Smith | 364/578 |
| 4,924,430 | 5/1990 | Zasio et al. | 364/578 |
| 5,197,015 | 3/1993 | Hartoog et al. | 364/490 |
| 5,274,568 | 12/1993 | Blinne et al. | 364/489 |
| 5,278,770 | 1/1994 | Gore et al. | 364/490 |
| 5,282,148 | 1/1994 | Poirot et al. | 364/491 |
| 5,293,327 | 3/1994 | Ikeda et al. | 364/578 |
| 5,305,229 | 4/1994 | Dhar | 364/489 |

Primary Examiner—Kevin J. Teska
Assistant Examiner—Susan Wieland

[57] ABSTRACT

A computer implemented method that first simulates the electronic circuit of each cell type within a circuit cell library using combinations of input transition time and load capacitances. The method reduces the results of the simulation to one of several models for the cell type. The method then reads an actual circuit description of the electronic circuit, and applies the models to the actual cells used in the circuit to determine signal delay through the circuit.

39 Claims, 17 Drawing Sheets

METHOD FOR DEFINING AND USING A TIMING MODEL FOR AN ELECTRONIC CIRCUIT

FIELD OF THE INVENTION

This invention relates to electronic circuits and more particularly to integrated electronic circuits. Even more particularly, the invention relates to a method for determining a timing model for an integrated electronic circuit.

BACKGROUND OF THE INVENTION

In integrated circuit design, circuits for commonly used functions, such as AND gates, OR gates, etc., are often combined into "cells", and a model is created for a cell. These models are used in circuit simulation to provide a simpler model of the cell than would be provided by simulating each of the components within a cell. Typically, the model is used to determine the delay of a signal through the cell, the transition time of the output signal and the input and output capacitance values for the cell.

The traditional model for delay of a signal through a cell is a two-coefficient model, similar to the equation for a line, where delay $= RD + LD * Ctot$. In this model, RD is a number representing the residual, or intrinsic, delay characteristics of the cell, and Ctot represents the capacitive load on the cell multiplied by a constant coefficient LD. Thus, in this model the delay through the cell is assumed to be a function only of the cell characteristics and its capacitive load.

More recently, a three-coefficient equation has been used to represent the delay through a cell. This equation is in the form of delay$=RD+LD*Ctot+TD*TRin$, wherein RD represents the residual, or intrinsic, delay characteristics of the cell, Ctot represents the capacitive load connected to the output of the cell, multiplied by a coefficient LD, and TRin represents the transition time of the input signal multiplied by a coefficient TD. Thus, in this model the delay through a cell is a function of its intrinsic characteristics, plus the capacitive load on the cell, plus the transition time of the input signal to the cell.

Both these models require an accurate calculation of the capacitive load of the circuits connected to the output of a cell. The three-coefficient model also requires an accurate determination of the input transition time for the signal being input to the cell, which requires an accurate determination of the output transition time of the signal output by another cell that is connected to the input of the cell. Where the transition time of the input signal is very fast for the process, or where the transition time is very slow for the process, the three-coefficient model is less accurate.

There is need in the art then for a method for determining the capacitive load for signals connected to the output of a cell. There is further need in the art for an improved cell model that improves the accuracy for fast and slow transition time signals. The present invention meets these and other needs in the art.

SUMMARY OF THE INVENTION

It is an aspect of the present invention to provide a timing model for an electronic circuit.

It is another aspect of the invention to provide a model more accurate than a traditional three coefficient model.

Another aspect is to provide a method of calculating the capacitive load on a cell within a circuit.

Still another aspect is to provide a method of calculating the output transition time of a signal output by a cell.

The above and other aspects of the invention are accomplished in a computer implemented method for determining delay, output transition time and capacitance models for each cell of a cell library, and then applying these models to actual cells used in a circuit to determine the delay of a signal through the circuit.

The method comprises accepting input signal transition time values and output capacitance load values from a user of the method, combining these values to produce sets of parameters, one set for each combination of the values, and performing multiple simulations of a circuit of each type of cell in the library using each set of parameters. The result of the simulations is a set of information indicating a time relationship between input signals and output signals of each type of cell for each simulation. This information is then analyzed to determine a delay between an input signal and an output signal of the circuit, determined at a specific location within the input and output signals, for each simulation that was performed. The delay and input parameter values are then reduced to a delay, output transition time, and capacitance equations for each type of cell in the cell library.

The method then reads an actual circuit description of the electronic circuit, where the actual circuit description defines connections between actual cells and the actual cells are selected from the cell library. It then applies the delay equations to the actual cells to determine the delay of the signal through the circuit.

BRIEF DESCRIPTION OF THE DRAWINGS

The above and other aspects, features, and advantages of the invention will be better understood by reading the following more particular description of the invention, presented in conjunction with the following drawings, wherein.

DESCRIPTION OF THE PREFERRED EMBODIMENT

The following description is of the best presently contemplated mode of carrying out the present invention. This description is not to be taken in a limiting sense but is made merely for the purpose of describing the general principles of the invention. The scope of the invention should be determined by referencing the appended claims.

Figure 1:
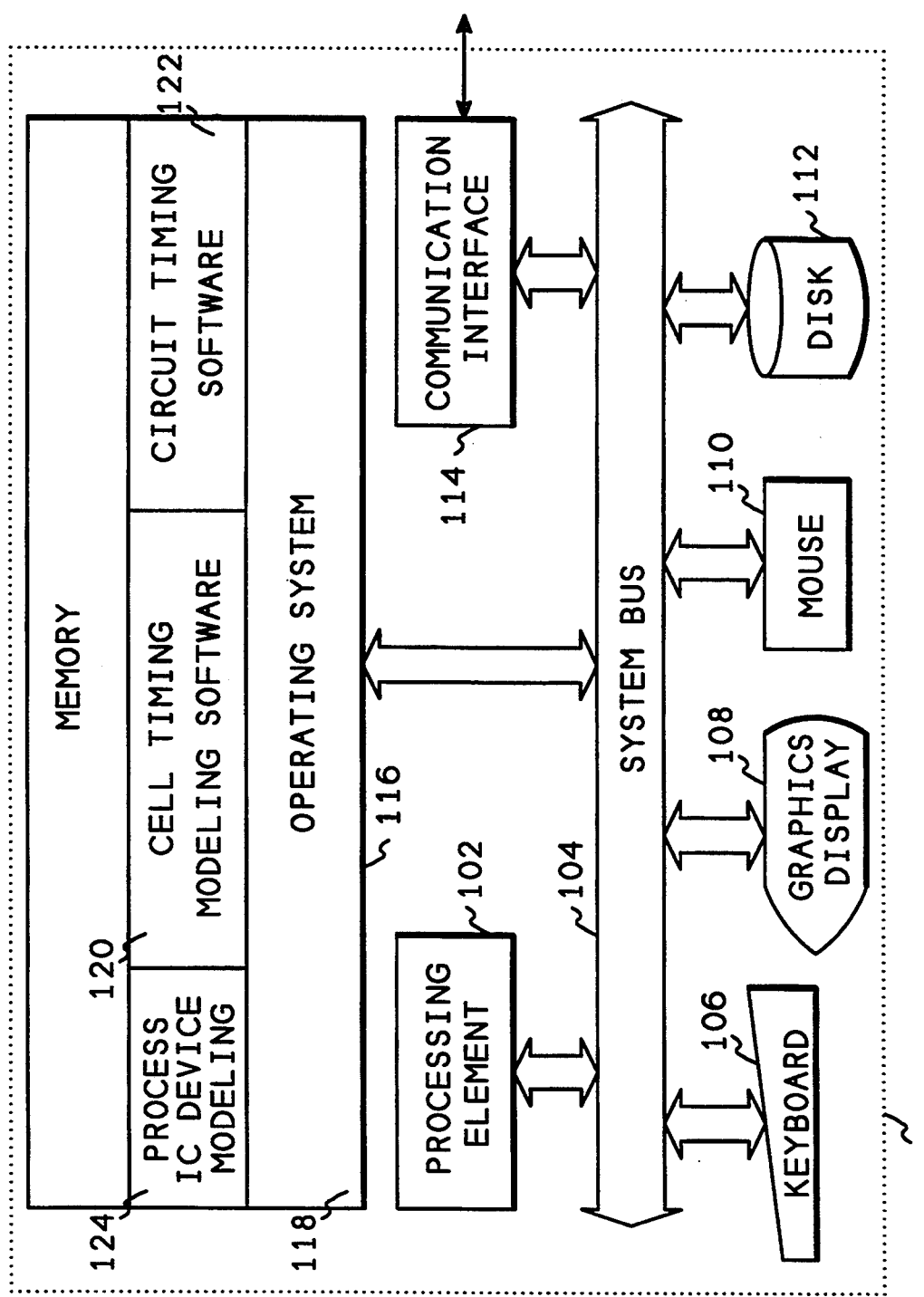
FIG. 1 shows a block diagram of a computer system incorporating the method of the present invention.

FIG. 1 shows a block diagram of a computer system incorporating the method of the present invention. Referring now to FIG. 1, a computer system 100 contains a processing element 102 which communicates to other elements of the computer system 100 over a system bus 104. A keyboard 106 captures text input to the computer system 100 and a mouse 110 captures graphical locator input to the computer system 100. A graphics display 108 provides output from the computer system 100 including both text and graphical output. A disk 112 is used to store the software of the present invention as well as data used by that software. A communications interface 114 allows the computer system 100 to communicate to other computer systems, and to communicate to test instruments used to measure data on circuits for modeling those circuits with the software of the present invention.

A memory system 116 contains an operating system 118 which is used by the software of the present invention. The operating system 118 could be any one of a number of conventional operating systems, such as the UNIX (tm) operating system used in workstations, or DOS operating systems used in personal computers. Process IC device modeling software 124 analyzes components for each IC manufacturing process to determine typical values. For example, capacitance values for diodes and FETs of each size used in the process are determined for the manufacturing process. These values are then used within the Cell timing modeling software 120 which analyzes the process IC device modeling data and other data to produce the coefficients for the cell models of the present invention. Circuit timing software 122 uses the cell models to determine the timing characteristics of a circuit input by a user. Other software, not shown in FIG. 1, is used by the present invention, such as other circuit simulator software, for example, the SPICE circuit simulator system.

Figure 2:
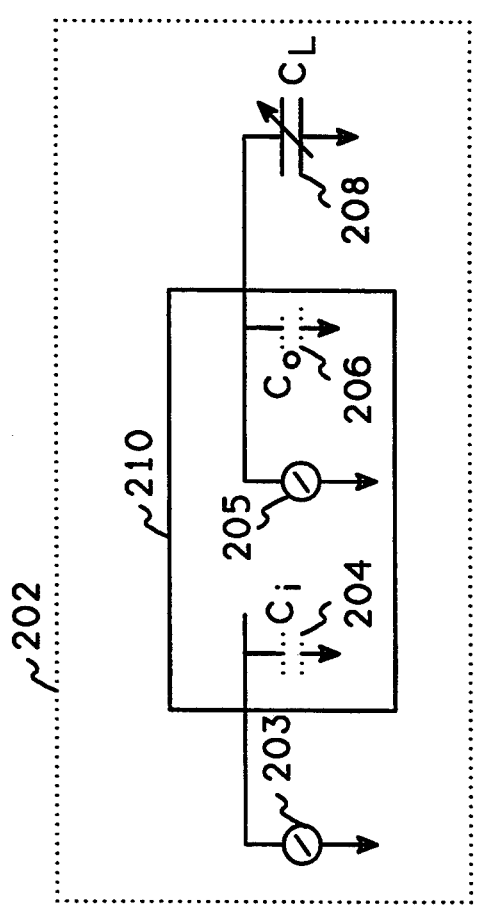
FIG. 2 shows a block diagram of an electronic circuit as modeled by the invention.

FIG. 2 shows a block diagram of an electronic circuit as might be modeled by the present invention. Referring now to FIG. 2, a cell 202 contains a circuit 210 which has a characteristic input capacitance 204, an output signal 205, and a characteristic output capacitance 206. A signal source 203 provides an input signal to the circuit 210 and this input signal has a characteristic transition time. The circuit 210 drives an output load, which has a capacitive component represented by variable capacitor 208, since the output load on a cell can vary depending on how it is used within a circuit. Typically the output signal 205 is the input signal 203 for the cells connected to the output of the cell 210.

Figure 3:
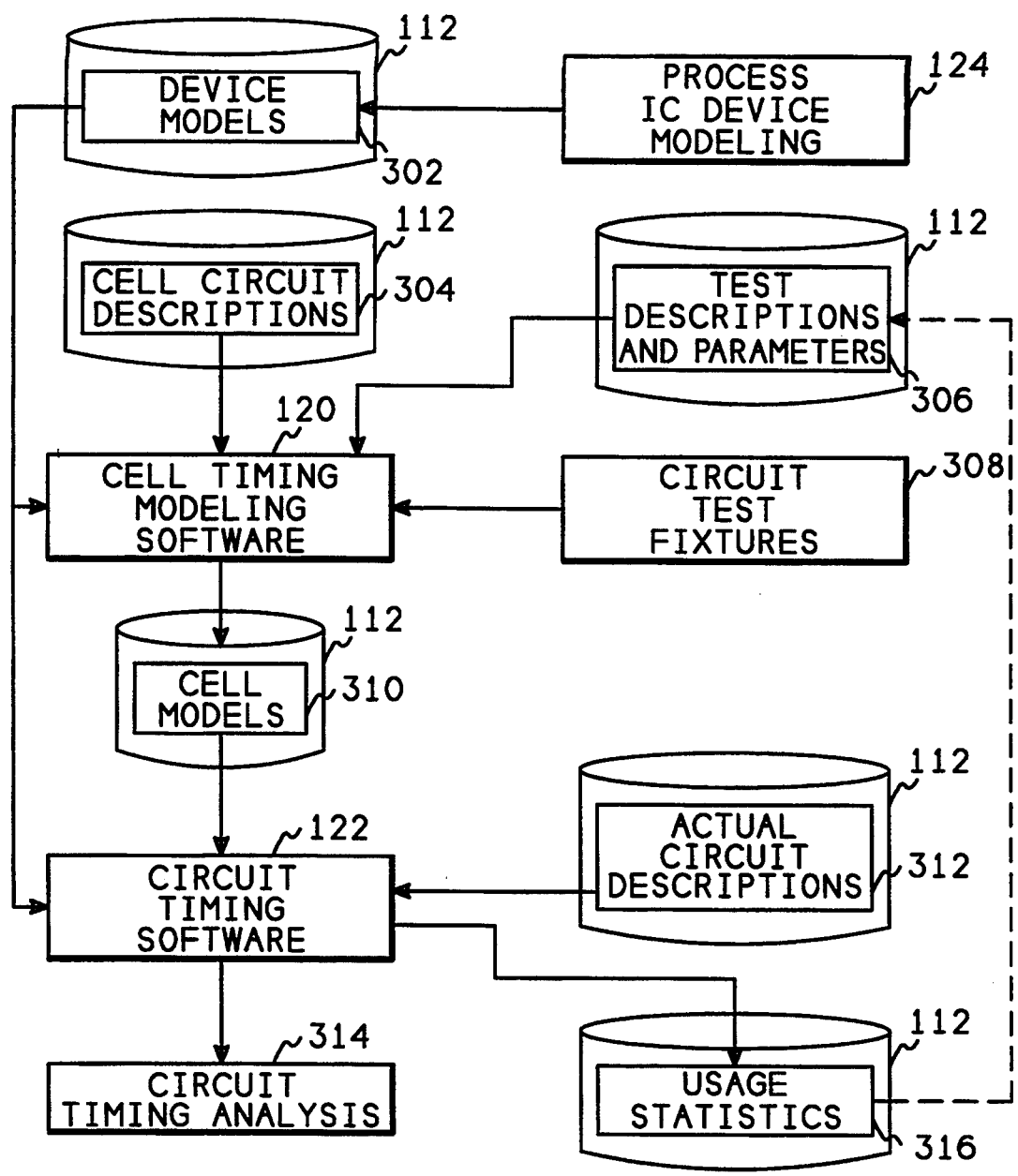
FIG. 3 shows a block diagram of an overview of the invention.

FIG. 3 shows a block diagram of an overview of the invention. Referring now to FIG. 3, Process IC device modeling software 124 creates a set of device models 302, for example, models of diodes, FETs, etc. A set of cell circuit descriptions 304, are stored on the disk 112 (FIG. 1) when the cells are defined for the IC manufacturing process. These would be cell descriptions for commonly used circuits, such as AND or OR logic circuits, or any other commonly used circuit. The device models 302 and circuit descriptions 304 are input to the cell timing modeling software 120 of the present invention, along with feedback information in the form of test descriptions and parameters 306. Also input to the cell timing modeling software 120 is input from circuit test fixtures 308 where actual circuits are measured and the waveforms then used to calculate the coefficients. A more complete description of the cell timing modeling software 120 is provided below with respect to FIG. 4. The output of the cell timing modeling software 120 is a set of cell models 310 which include equations for the delay through the cell, equations for output transition times, equations for input and output capacitances, and coefficients for those equations.

The cell models 310 are then input to circuit timing software 122 along with the actual circuit descriptions 312 provided by a user who has created a circuit using the cells. The circuit simulator software 122 then uses the model 310 in combination with the actual circuit description 312 to provide a circuit timing analysis 314 to the user, and to provide usage statistics 316 which can be fed back to the circuit test fixtures 308 in an iterative mode to improve the models.

Figure 4:
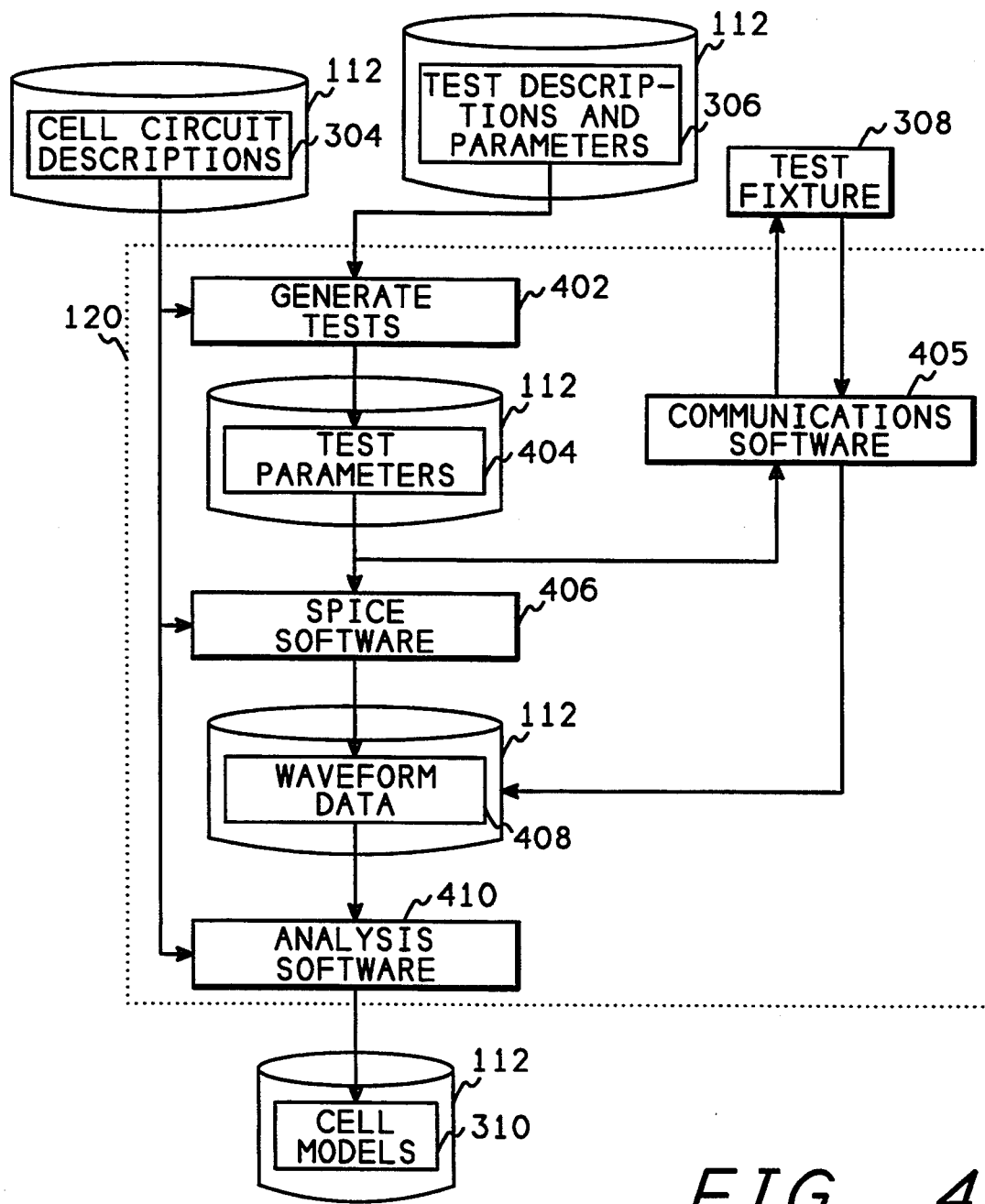
FIG. 4 shows a block diagram of the cell timing modeling software of FIG. 3.

FIG. 4 shows a block diagram of the cell timing modeling software 120 of FIGS. 1 and 3. Referring now to FIG. 4, test descriptions and parameters 306 are input to a generate tests block 402 that generates a set of test parameters 404 which are input to the SPICE software and also input to a test fixture 308. The SPICE software system is a well known software system used to simulate an electronic circuits. The SPICE software 406 simulates the circuit of a cell using the actual components of the cell from the cell circuit descriptions 304 and the test parameters 404 to produce a set of sample waveforms 408 for the cell, one waveform for each combination of test parameters 404.

Another method of obtaining sample waveforms for a cell is to build the circuit of the cell and electronically test the cell in a test fixture 308 using the test parameters 404. By testing the cell, and recording the output waveforms, the waveforms can be analyzed to determine the characteristics of the cell. Test parameters 404 are sent to the test fixture 308 through communications software 405 and waveform data from the test fixture 308 is input to the system through communications software 405 which uses the communications interface 114 (FIG. 1). After inputting the sample waveforms, communications software 405 stores the waveforms 408 on the disk 112.

After obtaining the waveforms 408, analysis software 410 reads the waveforms 408, along with the circuit cell descriptions 304 and analyzes these components to produce the cell models 310. The analysis software 410 is described below with respect to FIGS. 6–14.

One other function that may be performed by the analysis software 410 is to extrapolate the cell circuit descriptions 304 into a simpler model which can then be input to other existing circuit simulator software. This process is further described below with respect to FIG. 17. These models are then stored into the cell models file 310 on the disk 112 for use by the other simulation software. For example, a simulation software package called SynOpSys, produced by SynOpSys, Inc., uses a modified form of the three-coefficient equations to model the delay of a cell, and this modified from can be produced by the analysis software 410.

Figure 5:
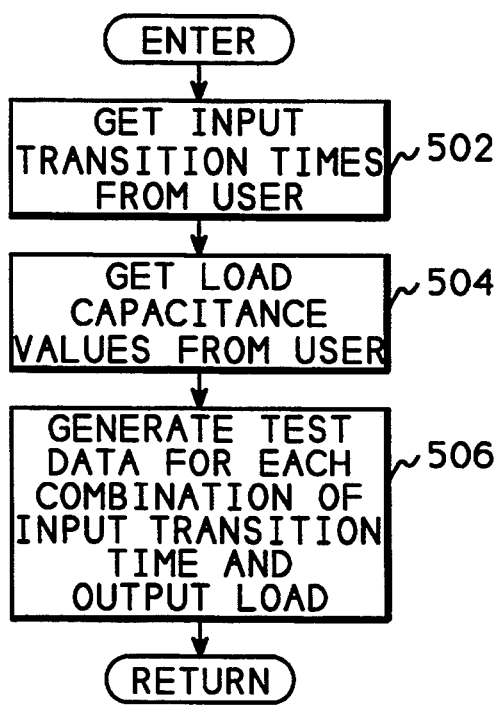
FIG. 5 shows a flowchart of the generate tests block 402 of FIG. 4.

FIG. 5 shows a flowchart of the generate tests block 402 of FIG. 4. Referring now to FIG. 5, after entry, block 502 reads transition time parameters from the test descriptions and parameters file 306, and block 504 reads load capacitance values from the file 306. These parameters are placed in the file 306 by a user of the system, based upon the typical uses for the cells. Block 506 then generates a set of test parameters for each combination of input transition time and output load capacitance.

As described above, the test data created by the process of FIG. 5 is input to the SPICE circuit simulation software, or any other circuit simulation software, which uses the test data and a description of the circuit of the cell to create a set of waveforms that represent operation of the cell under the conditions set by the test data. The waveforms are then input to the analysis software described below.

Figure 6:
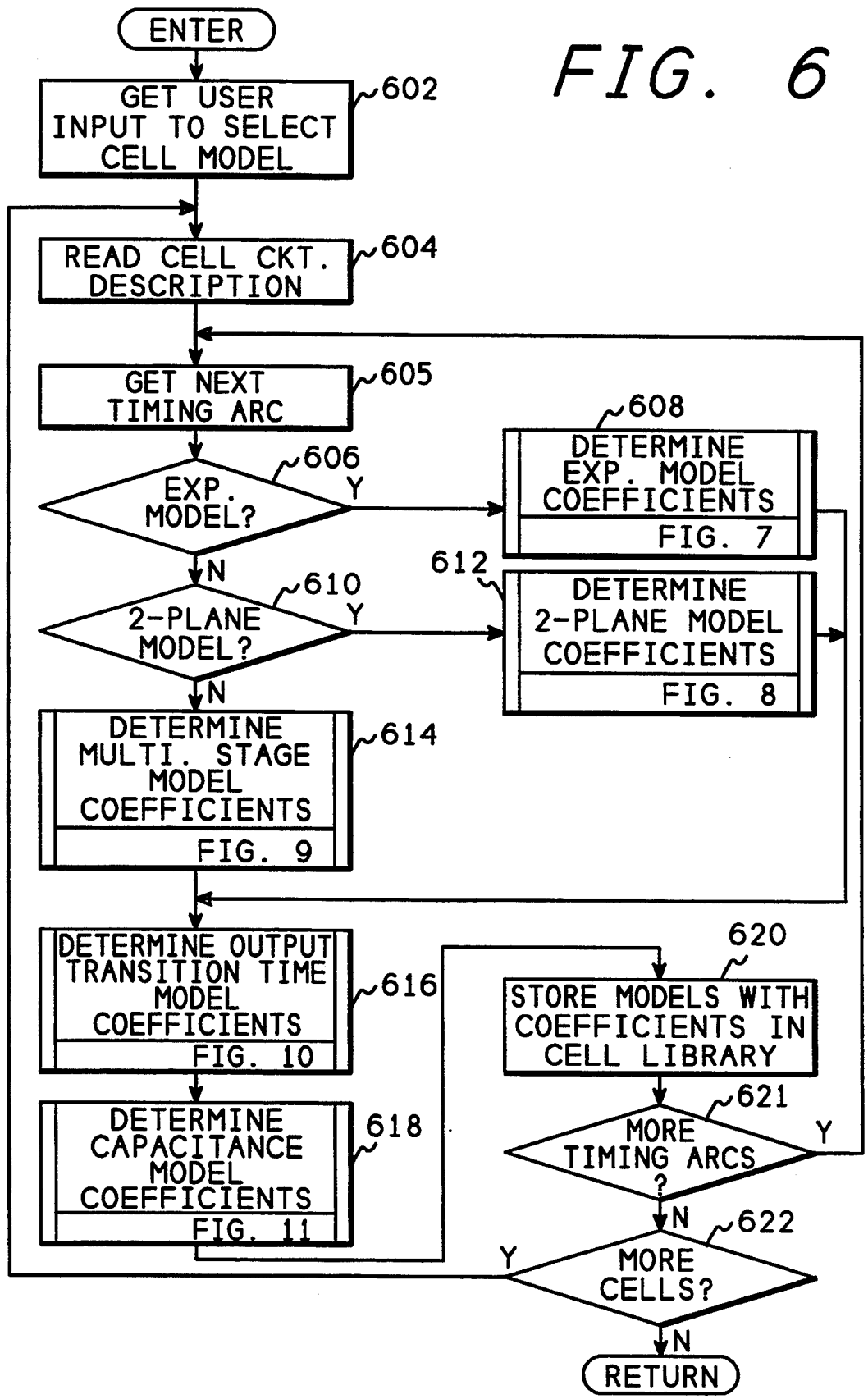
FIGS. 6–14 show a flowchart of the analysis software of FIG. 4.

FIGS. 6–14 describe the analysis software 410 of FIG. 4. Referring now to FIG. 6, after entry, block 602 gets user input to select the type of cell model the user desires. Block 604 then reads the cell circuit description from the file 304 (FIG. 4), and block 605 gets the first, or next, timing arc from the cell circuit description. A timing arc is a connection between one input to a cell and one output of the cell. For example, a cell with three inputs and two outputs would have six timing arcs. In addition, low to high transitions and high to low transitions could be separate timing arcs, as well as slow, nominal, and fast cases for each of the connections and transitions could be modeled as separate timing arcs.

Timing arcs can also be used to decompose a complicated cell into several simpler cells. This is done by creating a timing arc between an input and an internal node of the cell, rather that to an output of the cell. In effect, the internal node becomes an input/output node of the cell. Another timing arc would be created between the internal node and the output, thus breaking the cell into two cells.

Block 606 then determines whether the user requested that the exponential model be used. The exponential model is based on the three coefficient model, but has additional terms to account for the drop off at slow input transitions, and optionally rounding up or down for very fast inputs. The equation for the exponential model is as follows:

$$\text{Delay} = RD + LD * Ctot + TD * TRin - RF * TRin * \exp(- RE * Ctot/TRin) + LF * Ctot * \exp(- LE * TRin/Ctot)$$

Where RD, LD, TD, RF, RE, LF, and LE are model coefficients, Ctot is the total capacitance of the cells being driven by the cell being evaluated, and TRin is the input signal transition time.

Figure 7:
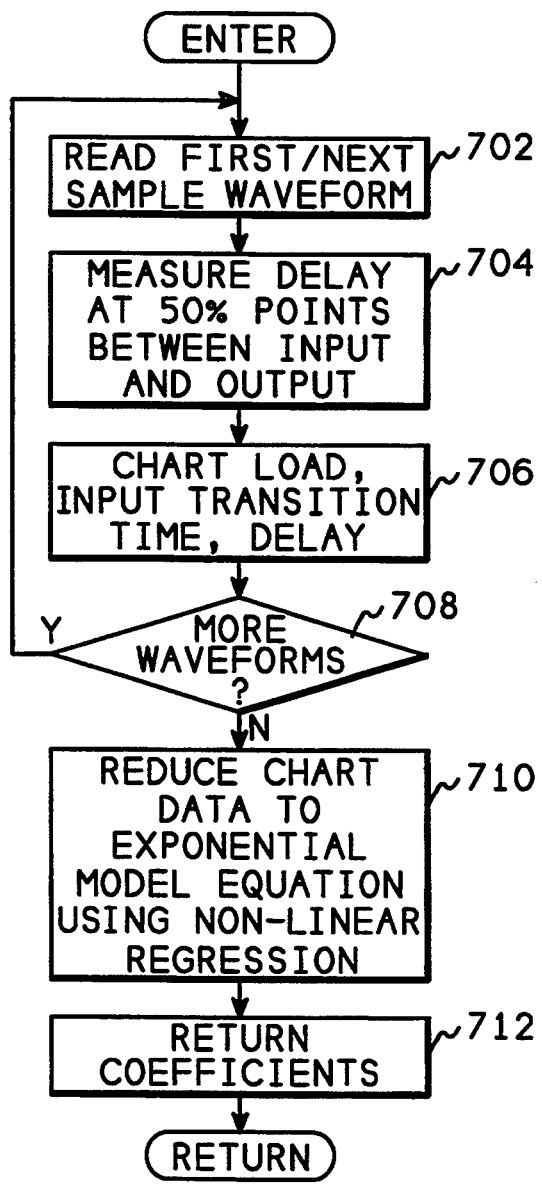

If the user desires that the exponential model be created, block 606 transfers to block 608 which calls FIG. 7 to determine the coefficients of the above equation and then control goes to block 616.

If the user does not select the exponential model, block 606 transfers to block 610 which determines whether the user has requested the two plane model.

The two plane model is simpler than the exponential model described above. If a three dimensional graph is created, for example using data such as in table 1 (described below), having the capacitive load graphed along the X axis, and delay graphed along Y axis, with input transition time graphed along the Z axis, the result is often a curved surface. This curved surface can be approximated by two flat planes, and the two plane model performs this approximation. Although exponential model provides a closer fit to an actual circuit, the two plane model is computationally simpler and easier to fit to the data. The equation for the two plane model is as follows:

$$\text{Delay} = \min(RD1 + LD1*Ctot + TD1*TRin, RD2 + LD2*Ctot + TD2*TRin)$$

Where the RD, LD, TD, Ctot and TRin are the same as described above for the exponential model, where the 1's after the coefficients represent the first plane, and where the 2's after the coefficients represent the second plane.

Figure 8:
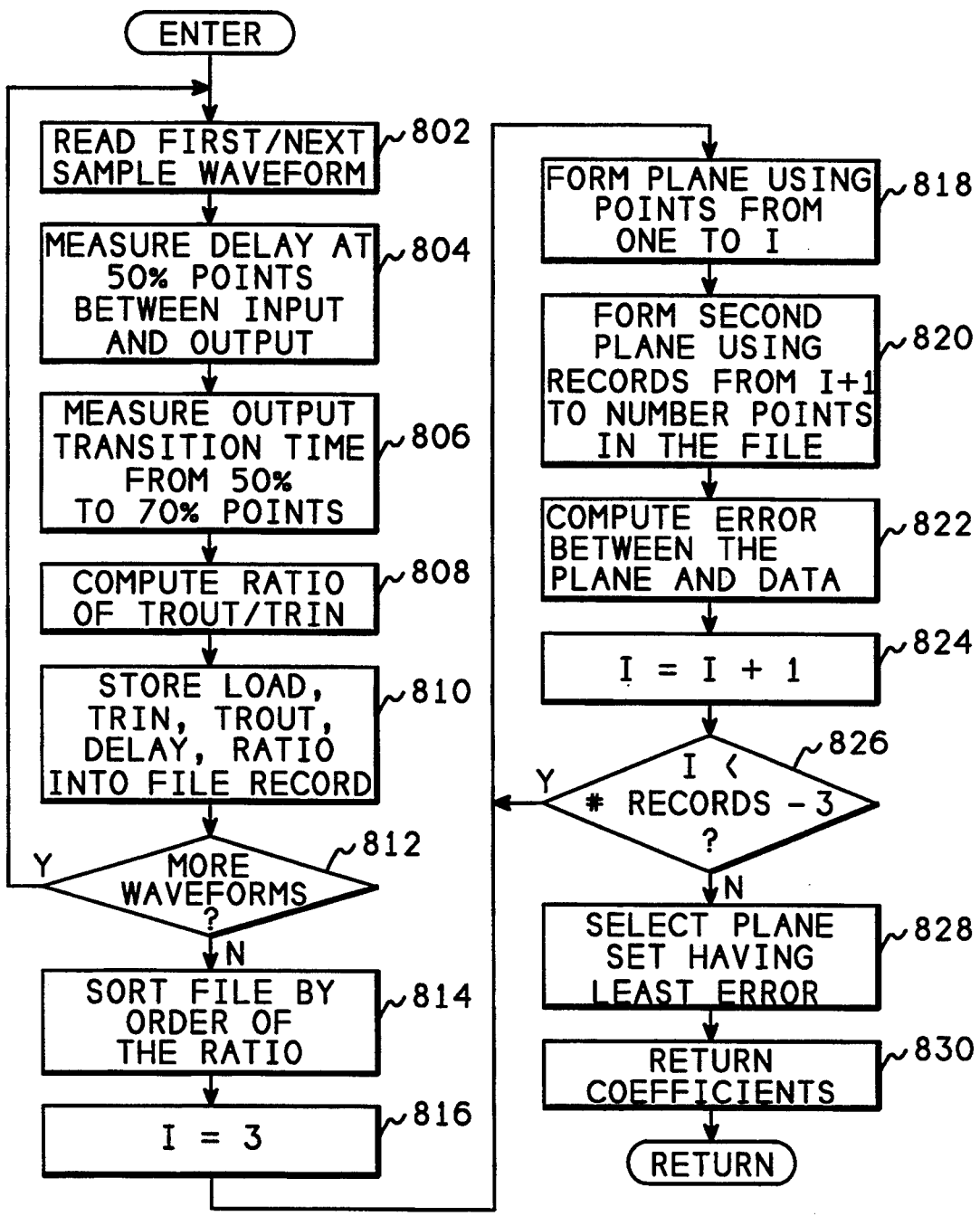

If the user selects the two plane model, block 610 transfers to block 612 which calls FIG. 8 to determine the coefficients of the two plane model equations and then control transfers to block 616.

Figure 17:
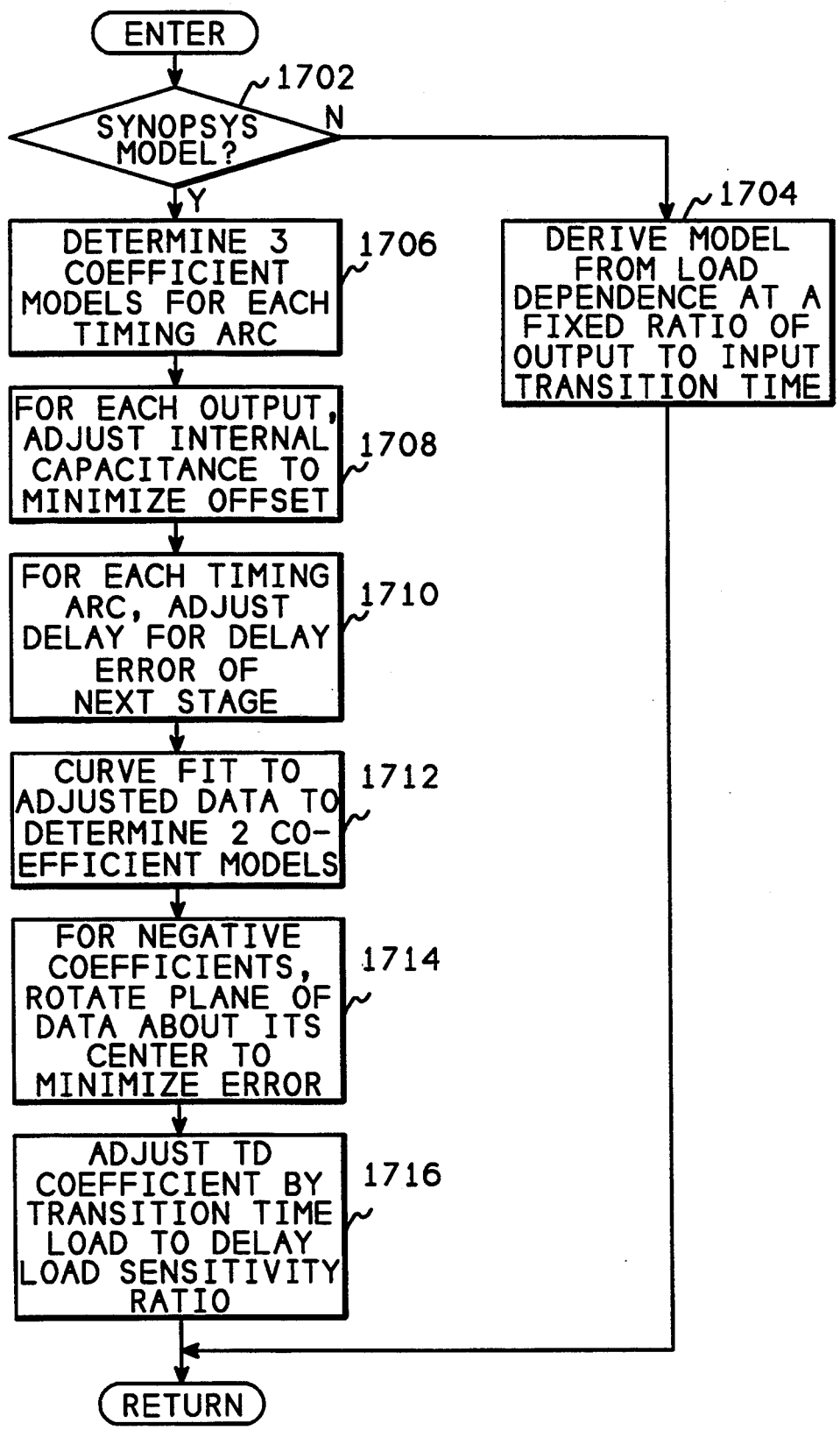
FIG. 17 shows a flowchart of the generate two coefficient model called from FIG. 6.

Although not shown in FIG. 6, the user could also select simpler two-coefficient models, and FIG. 6 would call FIG. 17 in the same manner that FIGS. 7 and 8 are called.

Figure 9:
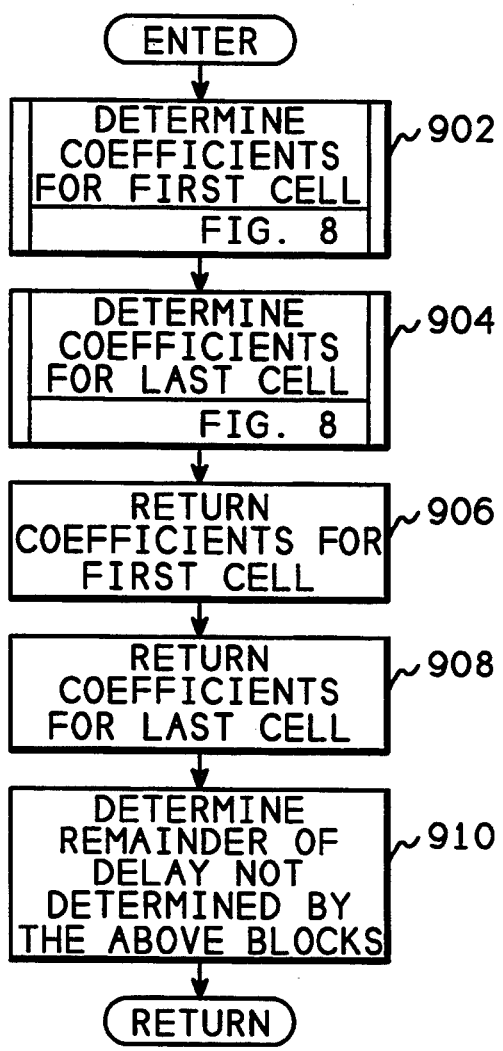

If the user has not selected a two plane model, block 610 transfers to block 614 which calls FIG. 9 to determine the coefficients for a multi-stage combination model.

For a multi-stage combination, wherein multiple cells are connected in series, a model can be created which approximates the entire series of cells. The equation for the multi-stage model is as follows:

$$\text{Delay} = RDi + \min(RDa1 + TDa1*TRin, RDa2 + TDa2*TRin) + \min(RDb1 + LDb1*Ctot, RDb2 + LDb2*Ctot)$$

where the RD, LD, TD, Ctot and TRin are the same as described above for the exponential model, where the 1's after the coefficients represent the first plane, and where the 2's after the coefficients represent the second plane, where the a's represent the first cell in the series, and the b's represent the last cell in the series.

In a multi-stage combination, the first stage will see a varying input transition time, and the last stage will see a varying capacitive load. Therefore, the equation above uses the components of the two plane model for transition time as applied to the input stage of the multi-stage combination, and the equation of the two plane model applied to the capacitive load for the output stage, and all intermediate stages are approximated by the delay coefficient RDi.

Figure 10:
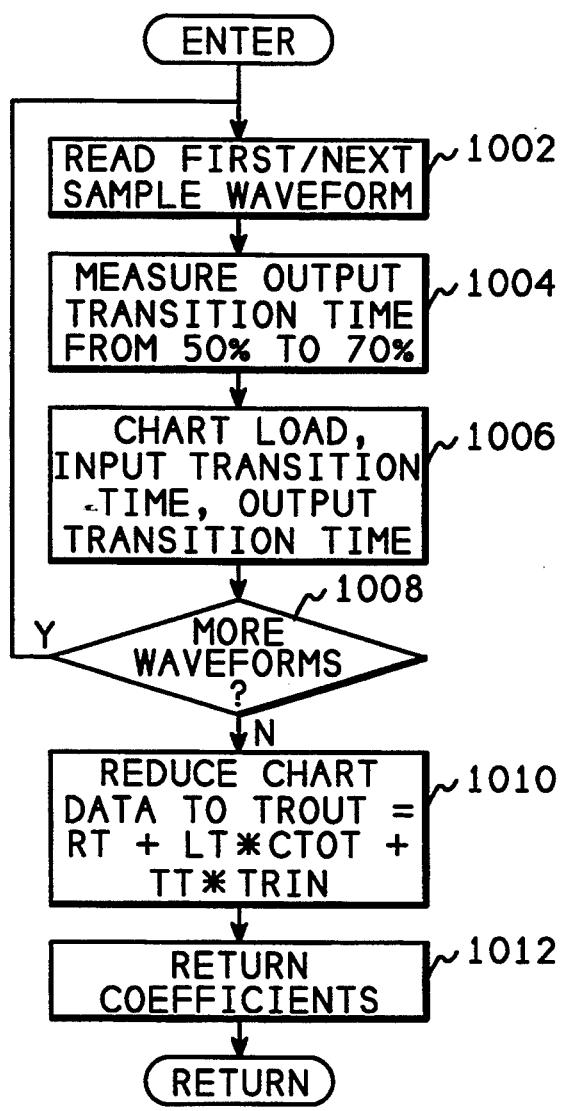

After determining the coefficients for the user selected model, control goes to block 616 which calls FIG. 10 to determine the output signal transition time model coefficients. The output signal transition time model is a basic three coefficient model as follows:

$$\text{TRout} = RT + LT*Ctot + TT*TRin$$

Wherein RT, LT, and TT are the model coefficients, Ctot is the total capacitance of the cells being driven by this cell, and TRin is the input signal transition time.

Figure 11:
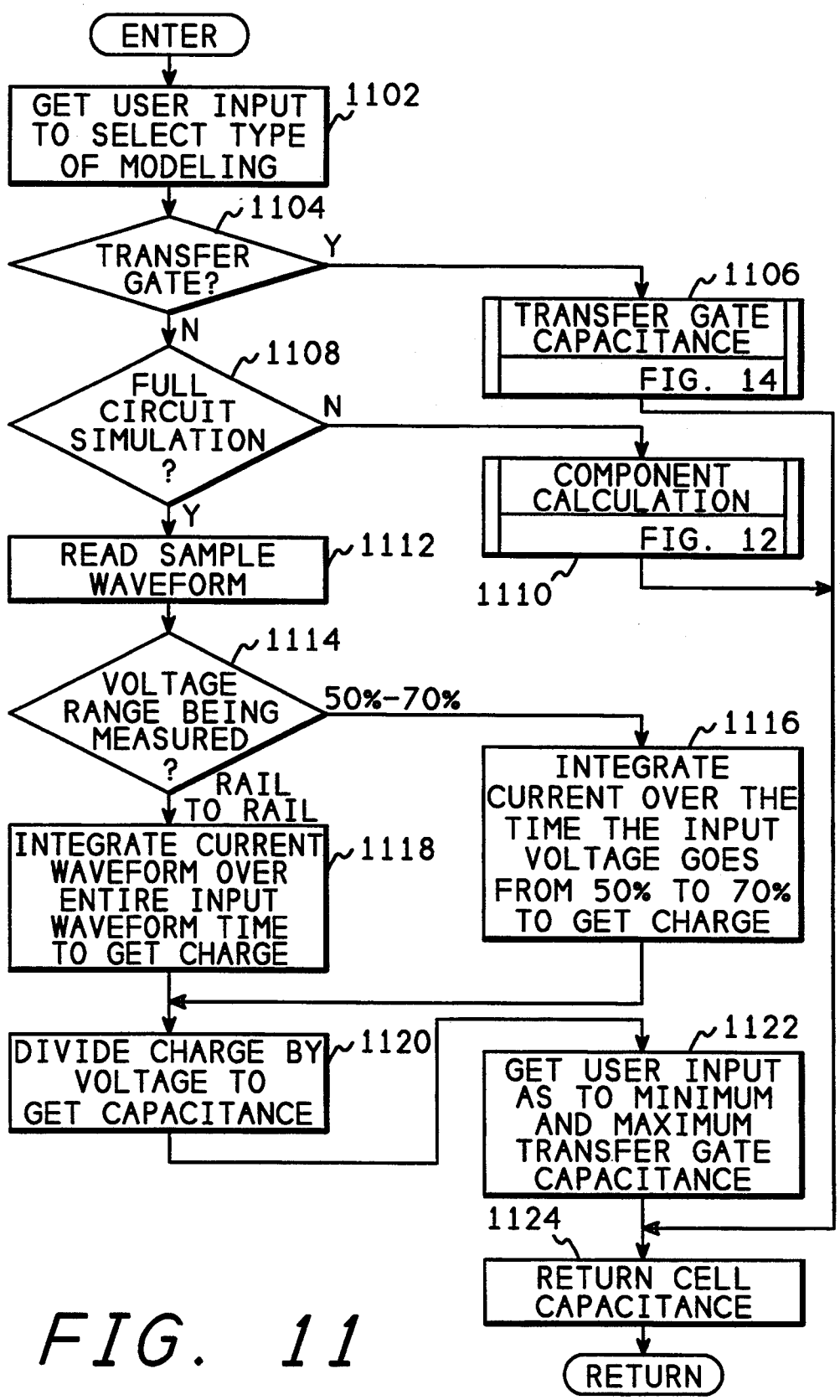

After determining the output signal transition time model coefficients, control goes to block 618 which calls FIG. 11 to determine the capacitance model coefficients. This determines the input capacitance and output capacitance as described above with respect to FIG. 2. Control then goes to block 620 which stores the models and coefficients in the cell library 310 and block 621 determines whether all timing arcs within this cell have been processed. If not, block 621 transfers back to block 605 to get the next timing arc. After all timing arcs have been processed, block 622 determines whether there are more cells to be processed. If there are more cells to be processed, block 622 returns to block 604 to read the next cell circuit description. After all cells have been processed the analysis software is complete, so FIG. 6 returns.

FIG. 7 shows a flowchart of the determine exponential model coefficients block 608 called from FIG. 6. Referring now to FIG. 7, after entry, block 702 reads the first or next sample waveform from the file 408 (FIG. 4). The sample waveforms are created either by SPICE circuit simulation software 406 (FIG. 4) or measured in a test fixture 308 and read back into the computer system 100 through communication software 404 (FIG. 4). In practice, once a cell circuit description is created, the user will process this circuit description through SPICE simulation software using a variety of output loads and input transition times defined in the test parameters file 404 (FIG. 4). For each combination of output load and input transition time, the SPICE software will create a waveform of the circuit under these conditions. Block 702 reads the sample waveforms one at a time.

After reading the first waveform, block 704 measures the delay between the input and output of the cell on the waveform, to determine the amount of delay through the cell. The point at which the delay is measured is the 50% point from one logic level to another. That is, the delay is measured from the point at which the input transition is halfway between one logic level and a second logic level, and the output transition is also halfway between the two logic levels. The delay could be measured at other points on the curve so long as the measurement is consistent.

After performing the measurement, block 706 places the load values for this measurement, the input signal transition time for the measurement, and the delay measured into a table which represents a chart. Block 708 then determines whether additional waveforms exist in the waveform data file 408, and if so, transfers back to 702 to process the next waveform.

The processing performed in blocks 702–708 is similar to the processing described below for blocks 802–812, and blocks 1002–1008. The processing for these three sets of blocks could be performed at one time to produce the information shown in table 1. Using this method, blocks 702–708, 802–812, and 1002–1008 would simply read the table data.

After all waveforms have been processed, block 708 transfers to block 710 which reduces the chart data accumulated in block 706 to the coefficients for the exponential model described above, using the technique of non-linear regression. The use of non-linear regression to reduce chart data to a single equation is well known in the art and will not be described further. After determining the coefficients, block 712 returns the coefficients to the process of FIG. 6.

FIG. 8 shows a flowchart of the determine two plane model coefficients called from block 612 of FIG. 6. Referring now to FIG. 8, after entry, block 802 reads the first or next sample waveform. These waveforms were created in the same manner as described above with respect to FIG. 7. Block 804 then measures the delay in the waveform at the 50% points in the same manner as described above with respect to block 704. Block 806 measures the output transition time that it takes the output to transit from the 50% point of the waveform to the 70% point to the waveform and block 808 computes the ratio of the output transition time divided by the input transition time. Block 810 then stores the output load for this sample, the input transition time for the sample, the output transition time for the sample, the delay for the sample, and the ratio computed in block 808 into a file record. Block 812 determines if there are more waveforms to be processed and if so, transfers back to block 802 to process the next waveform. After all waveforms have been processed block 812 transfers to block 814.

After the data has been collected into the file records, block 814 sorts the file by either ascending order or descending order of the ratio computed in block 808. Block 816 sets a variable I to the value 3, and block 818 forms a plane using data from records 1 to I. Initially, of course, this uses the first three records from the file and three points can be used to define a plane. Block 820 forms a plane using all the other records in the file, starting with record I+1 to the end of the file, to form a second plane. Block 822 determines an error measurement which represents the standard deviation of the planes from the data. Block 822 also stores the coefficients for the plane equations and the error measurement information into a second file. Block 824 increments the value of I and block 826 determines whether I is less than the number of file records minus 3. If this is true, block 826 transfers back to block 818 to form two more planes and determine an error measurement for each of these planes.

In the manner described above for blocks 816 through 826, two planes will be formed using various combinations of the records of the file where at least three records are used to form a plane. Thus, after completing this loop, the second file will contain a series of error measurements that indicate how closely the corresponding pair of planes matched the input delay data. Block 828 then selects the pair of planes that are the best fit to the input delay data, and block 830 returns the coefficients of the equations for these planes to FIG. 6.

FIG. 9 shows a flowchart of the equation for determining the multi-stage model coefficients called from block 614 of FIG. 6. Referring now to FIG. 9, block 902 calls FIG. 8 to determine the coefficients for the first cell in the multi-stage combination. Block 902 then calls FIG. 8 to determine the coefficients for the last cell in the multi-stage combination. Block 906 then returns the transition time coefficients for the first cell and block 908 returns the load coefficients for the last cell to FIG. 6. Block 910 determines the remainder of the delay through the multiple cells that has not been determined by blocks 902–908. This is the RDi parameter described above.

FIG. 10 shows a flowchart of the determine output signal transition time model coefficients called from block 616 of FIG. 6. Referring now to FIG. 10, after entry, block 1002 reads the first or next sample waveform from the waveform data file 408 (FIG. 4). Block 1004 then measures the transition time of the output signal as it goes from the 50% point to the 70% point between the two logic levels. Block 1006 stores the capacitive load for this waveform sample, the input signal transition time, and the output signal transition time for the sample into a table. Block 1008 then determines if there are more waveforms to process and if so, transfers back to block 1002 to process the next waveform.

After all the input sample waveforms have been processed, block 1010 reduces the data created in block 1006 to the coefficients of the transition time equation described above. Block 1012 then returns these coefficients to FIG. 6.

FIGS. 11–14 show a flowchart of the determine capacitance model coefficients called from block 618 of FIG. 6. Referring now to FIGS. 11–14, after entry, block 1102 gets user input to select the type of model to be used to determine the capacitance. Block 1104 then determines whether the cell being modeled is a transfer gate and if it is, block 1104 transfers to block 1106 which calls FIG. 14 to determine the input capacitance for the transfer gate. If the circuit is not a transfer gate, block 1104 transfers to block 1108 to determine whether the user requested a full circuit simulation, and if not, block 1108 transfers to block 1110 which calls FIG. 12 to calculate the component capacitance.

If the user requested a full circuit simulation, block 1108 transfers to block 1112 which reads sample waveform data from the waveform data file 408 (FIG. 4). Block 1114 then determines whether the voltage range being measured is from the 50% to the 70% points on the waveform, or whether the measurement is being done for the entire range from one logic level to another, that is, from rail to rail. If the range being measured is 50% to 70%, block 1114 transfers to block 1116 which integrates the current waveform over the time the input voltage goes from 50% to 70% to get the amount of charge accepted by the cell during the circuit simulation.

If the range being measured is from rail to rail, block 1114 transfers to block 1118 which integrates the current waveform over the entire input waveform time to get the charge accepted by the cell. After the charge has been determined by either block 1116 or block 1118, control goes to block 1120 which divides the charge by the voltage to get the capacitance value for the cell input. Block 1122 then gets additional user input for the fraction of the maximum transfer gate input capacitance that the user would like to have included in the model, and it inserts this fraction into the model. Block 1124 then returns the cell capacitance to FIG. 6.

Figure 12:
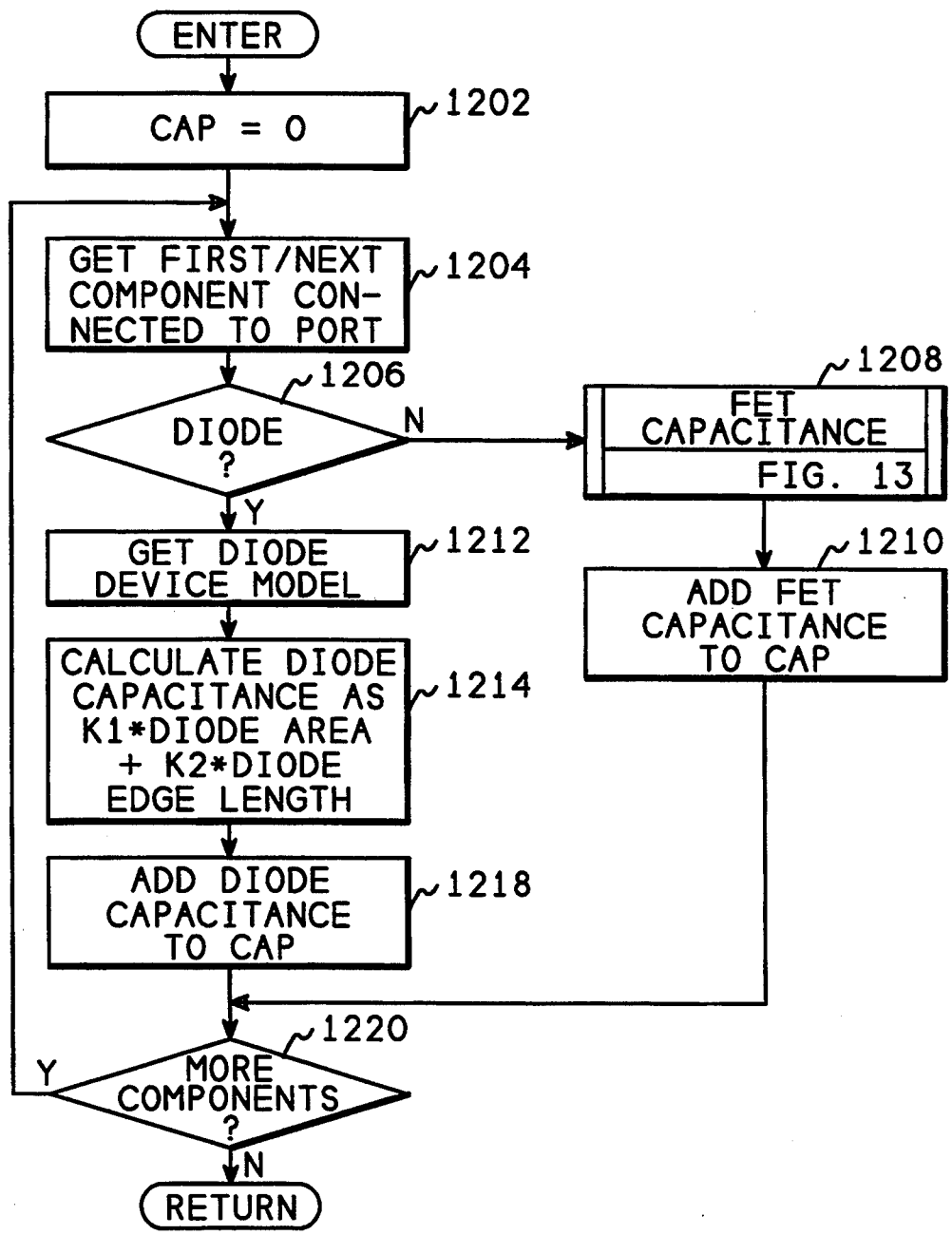

FIG. 12 shows a flowchart of the component capacitance calculation called from block 1110 of FIG. 11. Component capacitance calculation involves determining the capacitance for a cell from the input or output components connected to the input or output of the cell. That is, the capacitance of each transistor or diode connected to the input is determined and then the sum of all these capacitance values is created to get the capacitance value for the input to the cell. The output is done in a similar manner.

Referring now to FIG. 12, after entry, block 1202 sets the value of a variable CAP to zero. Block 1204 then gets the first or next component connected to the port of the cell, either the input port or an output port. Block 1206 then determines whether the component is a diode and if it is not, block 1206 transfers to block 1208 which calls FIG. 13 to determine the capacitance of a field effect transistor. After determining the field effect transistor capacitance, block 1210 adds this capacitance to the value of CAP, and transfers to block 1220.

If the component is a diode, block 1206 transfers to block 1214 which gets the diode device model from the device models file 302 (FIG. 3). This device model has been created previously by the process IC modeling software 124 (FIGS. 1 and 3) when the structure for a diode was defined for the process. After retrieving the diode device model, block 1214 calculates the diode capacitance from the size of the diode and constant values K1 and K2 which were determined by the process IC modeling software 124. Block 1218 adds this diode capacitance to the value of CAP.

Block 1220 then determines if there are more components connected to the port of the cell, and if so, transfers back to block 1204 to process the next component. After all components have been processed, the value of CAP is returned to FIG. 11 as the capacitance value.

Figure 13:
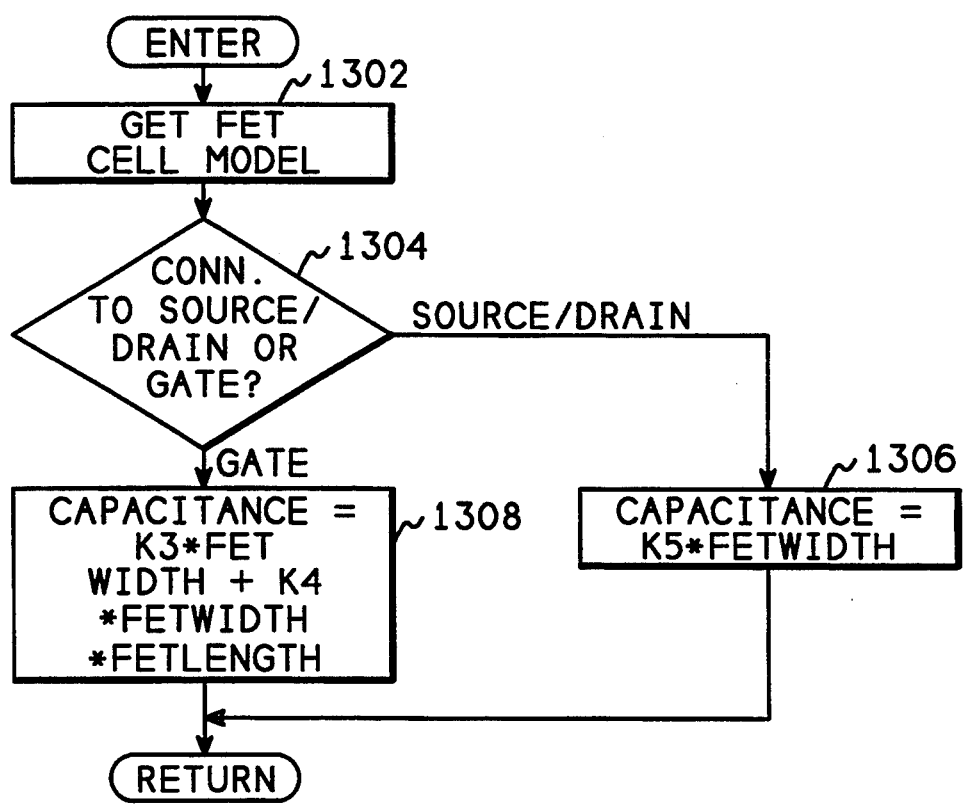

FIG. 13 shows a flowchart of the determine FET transistor capacitance called from block 1208 of FIG. 12. Referring now to FIG. 13, after entry, block 1302 gets the field effect transistor device model from the device models file 304 (FIG. 3). Block 1304 then determines whether the port is connected to the source/drain of the field effect transistor or to the gate. If the connection is to the gate, block 1304 transfers to block 1308 determines the capacitance from the size of the FET and constants K3 and K4 which were determined by the process IC device modeling software 124 (FIGS. 1 and 3).

If the connection is to the source/drain, block 1304 transfers to block 1306 which determines the FET capacitance from the size of the FET and constant K5 which was determined by the process IC device modeling software 124 (FIGS. 1 and 3).

Figure 14:
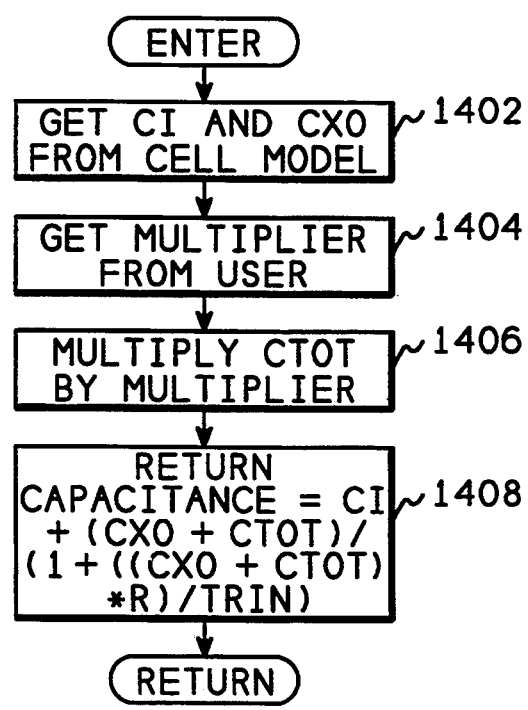

FIG. 14 shows a flowchart of the calculate transfer gate capacitance called from block 1106 of FIG. 11. Referring now to FIG. 14, after entry, block 1402 gets values for the cell input capacitance and output capacitance. When the cell model is created, two capacitance values are calculated. A first value represents the input capacitance (CI) when the transfer gate is off, which is determined using the FET and diode models described above with respect to FIGS. 12 and 13. The second value (CXO) represents the additional capacitance with the transfer gate is on.

Block 1404 gets user input to allow the user to specify how much of the load capacitance to use. This would be determined by the user by how often the gate will be on. Block 1406 then multiplies the load capacitance by the user multiplier to determine Ctot. Block 1408 then returns the coefficients for the equation:

$$Capacitance = CI + (CXO + Ctot)/(1 + ((CXO + Ctot)*R)/TRin)$$

where CI is the minimum effective capacitance of the input node to the transfer gate, CXO is the capacitance of the field effect transistor and output node, R is the resistance used for purposes of roll off, TRin is the transition time of the input signal to the transfer gate, and Ctot is the capacitance of the output nodes connected to the transfer gate.

The method of FIG. 14 could also be used for resistors, since a resistor performs in a manner similar to a transfer gate that is always on.

Figure 15:
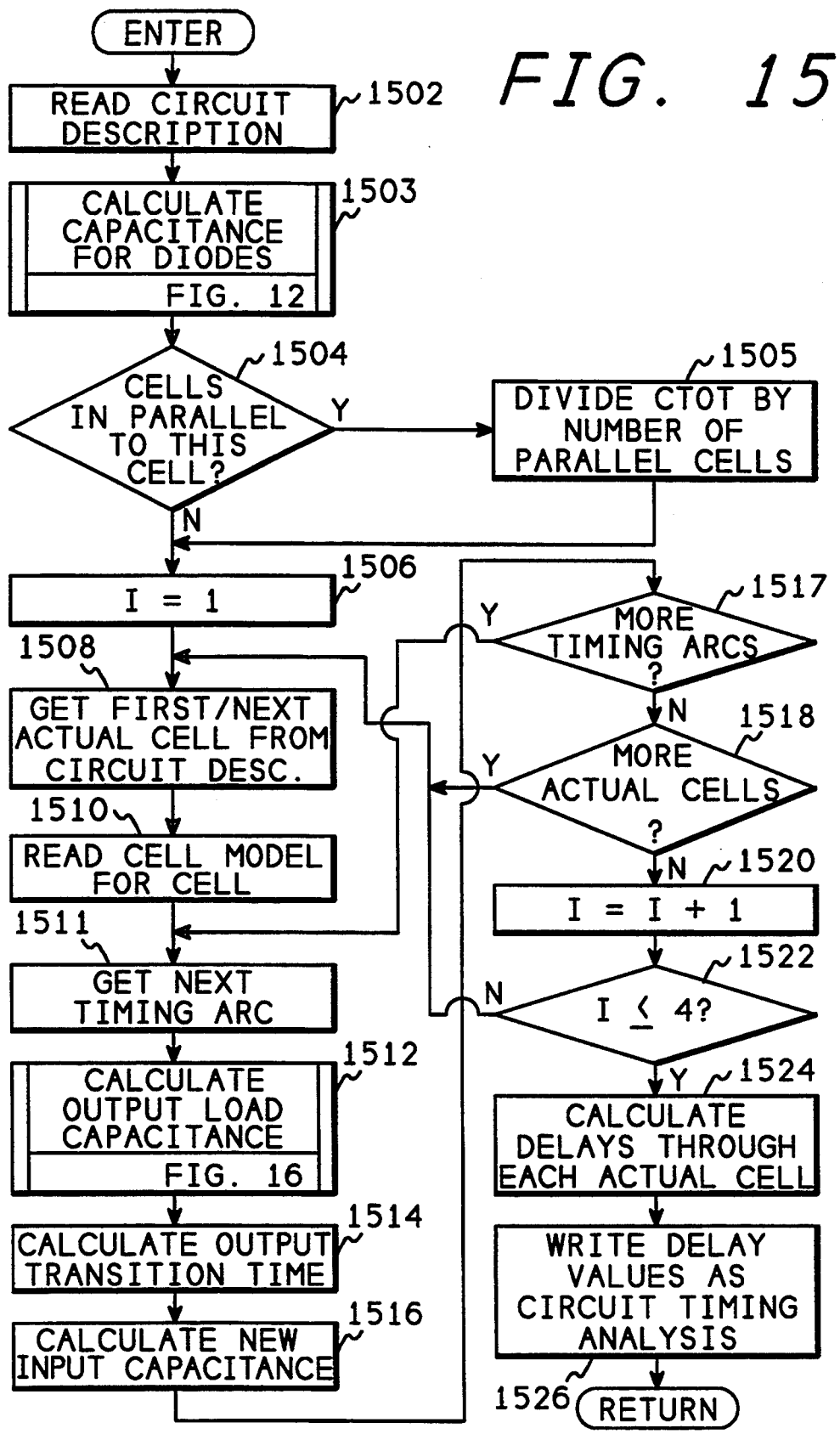
FIGS. 15–16 show a flowchart of the circuit timing software block 122 of FIG. 4.
Figure 16:
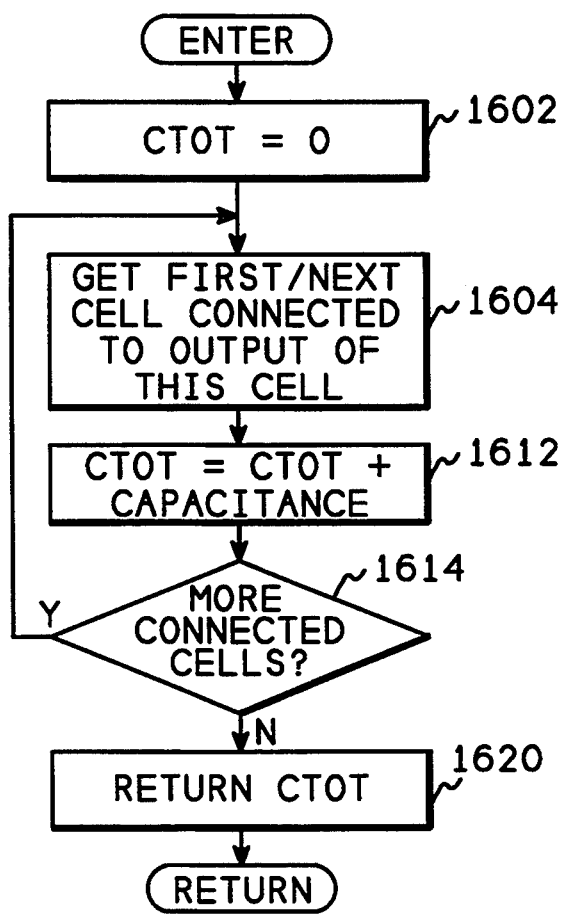

FIGS. 15 and 16 show a flowchart of the circuit timing software block 122 of FIG. 3. Referring now to FIGS. 15 and 16, after entry, block 1502 reads the circuit description from the actual circuit descriptions file 312 (FIG. 3). Block 1503 calls FIG. 12 to calculate the capacitance for all diodes in the circuit that are not included within a cell. Block 1504 determines whether there are cells in parallel to this cell, and if so, block 1505 divides the LD model parameter by the number of parallel cells.

Block 1506 sets the value of a variable I to 1 and block 1508 gets the first/next actual cell from the actual circuit description file 312 (FIG. 3). Block 1510 reads the cell model for the cell type used as the actual cell from the cell models file 310 (FIG. 3), and block 1511 gets the next timing arc from for the cell. Block 1512 calls FIG. 16 to calculate the capacitance for the cells connected to this timing arc. This capacitance is used as the Ctot value in the delay, transition time, and capacitance equations. Block 1514 then uses the transition time equations for the cell model calculate the new output transition time for the cell in the circuit. Block 1516 calculates the new input capacitance for the cell, and block 1517 determines if there are more timing arcs for the cell. If there are more timing arcs, block 1517 transfers back to block 1511 to process the next timing arc. After all timing arcs are processed, block 1518 determines if there are more cells within the circuit description. If there are more cells, block 1518 transfers back to block 1508 to process the next cell within the circuit.

After all cells within the circuit have been processed, block 1518 transfers to block 1520 which increments the value of the variable I and block 1522 then determines whether four passes have been completed.

Because the equations for the cell models involve input transition time and capacitance values that are a function of input transition time, calculation of the actual capacitances and transition times is a recursive operation. In practice, four passes through the circuit causes adequate convergence for determining the actual transition times, delays, and capacitance values.

After four passes have been completed, block 1522 transfers to block 1524 which calculates the delays through each of the cells using the transition time and capacitance values computed above. Block 1526 then writes these delays as the circuit timing analysis block 314 (FIG. 3) and to the usage statistics file 316 (FIG. 3).

FIG. 16 shows a flowchart of the process for calculating the load capacitance of a cell. Referring now to FIG. 16, after entry, block 1602 sets the value for Ctot to zero. Block 1604 gets the first, or next cell connected to the output of this cell.

Block 1612 adds the capacitance value for the cell to Ctot and block 1614 determines if there are more cells connected to the output. If there are additional connected cells, block 1614 transfers back to block 1604 to process the next cell. After all cells have been processed, control then goes to block 1620 which returns Ctot to FIG. 15.

FIG. 17 shows a flowchart of the derive coefficients for simpler models described above with respect to FIG. 4. FIG. 17 would be called by FIG. 6 when a user requests a simpler model, in the same manner that FIG. 7 is called by FIG. 6 to derive the coefficients for the exponential model.

Referring now to FIG. 17, after entry, block 1702 determines whether coefficients for the SynOpSys model are requested. If not, control goes to block 1704 which reduces the three coefficient model to a two coefficient model by using a ratio of the output transition time to the input transition time.

If a SynOpSys model is requested block 1702 goes to block 1706 which determines a 3 coefficient model for each timing arc of the cell. Block 1708 adjusts the internal capacitance of the cell to minimize the delay offset. This is necessary because the SynOpSys model does not have a constant term, that is, the standard two coefficient model is $To=K_1+K_2*Ctot$, whereas the SynOpSys model is $To=K_3*Ctot$. Block 1708 adjusts the internal capacitance of the cell to allow for both $K_1$ and $K_2$.

Block 1710 determines the likely delay error of the next cell connected to the output of this cell, based on the known difference between the transition time and the cell model of the next cell, and adjusts the delay of this cell for the error. Block 1712 then fits a curve to the adjusted data to derive the SynOpSys model. If any coefficients are negative, block 1714 rotates the plane of the data about its center to minimize the error, and then block 1716 adjusts the TD coefficient by the transition time load sensitivity to delay load sensitivity ratio and returns the model to FIG. 6.

Having thus described a presently preferred embodiment of the present invention, it will now be appreciated that the aspects of the invention have been fully achieved, and it will be understood by those skilled in the art that many changes in construction and circuitry and widely differing embodiments and applications of the invention will suggest themselves without departing from the spirit and scope of the present invention. The disclosures and the description herein are intended to be illustrative and are not in any sense limiting of the invention, more preferably defined in scope by the following claims.

TABLE 1

| Load  | TRin   | Delay   | TRout  | Ci      |
|-------|--------|---------|--------|---------|
| .1 pf | .15 ns | .52 ns  | .18 ns | .02 pf  |
| .2 pf | .15 ns | .63 ns  | .28 ns | .02 pf  |
| .3 pf | .15 ns | .74 ns  | .38 ns | .02 pf  |
| .4 pf | .15 ns | .85 ns  | .48 ns | .02 pf  |
| .1 pf | .26 ns | .62 ns  | .20 ns | .024 pf |
| .2 pf | .26 ns | .73 ns  | .30 ns | .024 pf |
| .3 pf | .26 ns | .84 ns  | .40 ns | .024 pf |
| .4 pf | .26 ns | .95 ns  | .50 ns | .024 pf |
| .1 pf | .37 ns | .70 ns  | .23 ns | .028 pf |
| .2 pf | .37 ns | .82 ns  | .32 ns | .028 pf |
| .3 pf | .37 ns | .94 ns  | .42 ns | .028 pf |
| .4 pf | .37 ns | 1.05 ns | .52 ns | .028 pf |

What is claimed is:

1. A computer implemented method for determining delay of a signal through an electronic circuit, said computer implemented method comprising the steps of:

(a) accepting a plurality of input signal transition time values and output capacitance load values from a user of the method;

(b) combining said plurality of input signal transition time values and output capacitance load values to produce a plurality of sets of parameters, one set of parameters for each combination of input signal transition time value and output capacitance load value;

(c) for each one type of a plurality of types of cells used within said electronic circuit, simulating a circuit of said one type of cell once for each set of parameters, wherein each said simulation produces a set of information indicating a time relationship between input signals and output signals of said one type of cell for each set of parameters;

(d) for each set of information produced in step (c) for each one type of cell, determining a delay between said input signals and output signals at a predefined location within each of said signals, and adding said delay to a corresponding one of said set of parameters;

(e) reducing said set of parameters to a delay equation for each one type of said plurality of types of cells of said electronic circuit wherein said delay equation comprises $$\text{Delay} = RD + LD * Ctot + TD * TRin -$$
$$RF * TRin * \exp(-RE * Ctot/TRin) +$$
$$LF * Ctot * \exp(-LE * TRin/Ctot)$$

where RD, LD, TD, RF, RE, LF, and LE are constants determined by said reducing said set of parameters, Ctot is a capacitance value for a load connected to an output of said one type of said plurality of types of cells, TRin is an input transition time of a signal connected to an input of said one type of said plurality of types of cells, * represents multiplication, and exp represents exponentiation;

(f) inputting an actual circuit description of said electronic circuit wherein said actual circuit description defines connections between actual cells to produce said electronic circuit, wherein said actual cells are selected from said plurality of types of cells;

(g) applying said delay equations to said actual cells of said actual circuit description to determine said delay of said signal through said electronic circuit.

2. The method of claim 1 wherein step (d) further comprises determining said delay at a predefined location half way between a low logic level and a high logic level voltage.

3. The method of claim 1, wherein step (e) further comprises the following step (e1), and wherein step (g) further comprises the following step (g1):

(e1) reducing said set of parameters to an output transition time equation for each one type of said plurality of types of cells of said electronic circuit wherein said output transition time equation comprises $$TRout = RT + LT*Ctot + TT*TRin$$

where RT, LT, and TT are constants determined by said reducing said set of parameters, Ctot is a capacitance value for a load connected to an output of said one type of said plurality of types of cells, TRin is an input transition time of a signal connected to an input of said one type of said plurality of types of cells, and * represents multiplication;

(g1) using an output signal transition time of a first cell as an input transition time of a cell connected to an output of said first cell.

4. The method of claim 3 wherein step (g1) further comprises the step of performing all calculations for said actual cells a predetermined number of times before applying said delay equation to determine said signal delay.

5. The method of claim 1 wherein step (c) further comprises the following step (c1), step (e) further comprises the following steps (e1) and (e2), and step (g) further comprises the following step (g1):

(c1) simulating said circuit to produce input current information over a time of said simulation;

(e1) integrating said current information over said time of said simulation to produce a charge value;

(e2) dividing said charge value by a voltage input to said cell during said simulating to produce an input capacitance for said one type of said plurality of types of cells and adding said input capacitance to a corresponding one of said set of parameters; and (g1) summing input capacitance values for output cells connected to an output of each actual cell to determine said Ctot value for said actual cell.

6. The method of claim 5 wherein step (e1) further comprises the step of integrating said current during a time said input signal changes over a predetermined percentage of the voltage difference between logic level voltages used in said simulating.

7. The method of claim 1 wherein step (c) further comprises the following step (c1), step (e) further comprises the following steps (e1) and (e3), and step (g) further comprises the following step (g1):

(c1) simulating each active component within said circuit to produce input current information over a time of said simulation;

(e1) integrating said current information for each active component connected to an input of said one type of said plurality of types of cells over said time of said simulation to produce a component charge value;

(e2) dividing said component charge value by a voltage input to said active component during said simulating to produce a component capacitance for said component;

(e3) summing said component capacitance value for each component in said one type of said plurality of types of cells to produce an input capacitance value for said one type of said plurality of types of cells and adding said input capacitance to a corresponding one of said set of parameters; and (g1) summing input capacitance values for output cells connected to an output of each actual cell to determine said Ctot value for said actual cell.

8. The method of claim 7 wherein step (e1) further comprises the step of integrating said current during a time said input signal changes over a predetermined percentage of the voltage difference between logic level voltages used in said simulating.

9. The method of claim 1 wherein step (e) further comprises the step of reducing said set of parameters using the method of non-linear regression.

10. The method of claim 1 wherein step (g) further comprises the step of:

(g1) when a plurality of actual cells are driving a same output in parallel, dividing the value of Ctot for each of said plurality of actual cells by the number of actual cells driving said same output.

11. The method of claim 1, wherein step (e) further comprises the following step:

(e1) when said type of said plurality of types of cells is a transfer gate, reducing said set of parameters to an input capacitance equation for each one type of said plurality of types of cells of said electronic circuit wherein said input capacitance equation comprises $$CIeff = Ci + (Cxo + Ctot)/(1 + ((Cxo + Ctot)*R)/TRin)$$

where Ci, Cxo and R are constants determined by said reducing said set of parameters, Ctot is a capacitance value for a load connected to an output of said one type of said plurality of types of cells, TRin is an input transition time of a signal connected to an input of said one type of said plurality of types of cells, / represents division, and * represents multiplication.

12. A computer implemented method for determining delay of a signal through an electronic circuit, said computer implemented method comprising the steps of:
(a) accepting a plurality of input signal transition time values and output capacitance load values from a user of the method;
(b) combining said plurality of input signal transition time values and output capacitance load values to produce a plurality of sets of parameters, one set of parameters for each combination of input signal transition time value and output capacitance load value;
(c) for each one type of a plurality of types of cells used within said electronic circuit, simulating a circuit of said one type of cell once for each set of parameters, wherein each said simulation produces a set of information indicating a time relationship between input signals and output signals of said one type of cell for each set of parameters;
(d) for each set of information produced in step (c) for each one type of cell, determining a delay between said input signals and output signals at a predefined location within each of said signals, and adding said delay to a corresponding one of said set of parameters;
(e) reducing said set of parameters to a delay equation for each one type of said plurality of types of cells of said electronic circuit wherein said delay equation comprises $$Delay = min(RD1 + LD1*Ctot + TD1 * TRin, RD2 + LD2*Ctot + TD2*TRin)$$

where RD1, LD1, and TD1 are constants determined by said reducing said set of parameters from a first plane defined from a first group of at least three parameters from said set of parameters, RD2, LD2, and TD2 are constants determined by said reducing said set of parameters from a second plane defined from a second group of at least three parameters from said set of parameters, Ctot is a capacitance value for a load connected to an output of said one type of said plurality of types of cells, TRin is an input transition time of a signal connected to an input of said one type of said plurality of types of cells, * represents multiplication, and min represents taking the minimum of RD1+LD1*Ctot+TD1*TRin and RD2+LD2*Ctot+TD2*TRin;
(f) inputting an actual circuit description of said electronic circuit wherein said actual circuit description defines connections between actual cells to produce said electronic circuit, wherein said actual cells are selected from said plurality of types of cells;
(g) applying said delay equations to said actual cells of said actual circuit description to determine said delay of said signal through said electronic circuit.

13. The method of claim 12 wherein defining said first and second planes for a cell in step (e) comprises the steps of:
(e1) for each set of information produced in step (c) for each one type of cell, determining an output signal transition time value between predefined locations within an output signal, and adding said output signal transition time value to a corresponding one of said set of parameters;
(e2) for each set of information produced in step (e1), dividing said output signal transition time value by said input signal transition time value to produce a transition time ratio;
(e3) sorting records of said set of information in order by said transition time ratio to produce a sorted set of information;
(e4) setting a value for a variable I to 3;
(e5) selecting records one through I from said sorted set of information as a first group and selecting records I+1 through a last element from said sorted set of information as a second group;
(e6) using said first group of records from said sorted set of information and said second group of records from said sorted set to form a pair of planes;
(e7) measuring a standard deviation value of a standard deviation of each of said pair of planes from said records and storing said standard deviation value in a corresponding one of said sorted set of information;
(e8) repeating steps (e5) through (e7) while increasing I by one until I equals a number of records in said sorted set of information minus 3;
(e9) selecting a pair of planes from said sorted set having a lowest standard deviation value.

14. The method of claim 12 wherein step (d) further comprises determining said delay at a predefined location half way between a low logic level and a high logic level voltage.

15. The method of claim 14 wherein step (g1) further comprises the step of performing all calculations for said actual cells a predetermined number of times before applying said delay equation to determine said signal delay.

16. The method of claim 12, wherein step (e) further comprises the following step (e1), and wherein step (g) further comprises the following step (g1):
(e1) reducing said set of parameters to an output transition time equation for each one type of said plurality of types of cells of said electronic circuit wherein said output transition time equation comprises $$TRout = RT + LT*Ctot + TT*TRin$$

where RT, LT, and TT are constants determined by said reducing said set of parameters, Ctot is a capacitance value for a load connected to an output of said one type of said plurality of types of cells, TRin is an input transition time of a signal connected to an input of said one type of said plurality of types of cells, and * represents multiplication;
(g1) using an output signal transition time of a first cell as an input transition time of a cell connected to an output of said first cell.

17. The method of claim 12 wherein step (c) further comprises the following step (c1), step (e) further comprises the following steps (e1) and (e2), and step (g) further comprises the following step (g1):
(c1) simulating said circuit to produce input current information over a time of said simulation;
(e1) integrating said current information over said time of said simulation to produce a charge value;
(e2) dividing said charge value by a voltage input to said cell during said simulating to produce an input capacitance for said one type of said plurality of types of cells and adding said input capacitance to a corresponding one of said set of parameters; and (g1) summing input capacitance values for output cells connected to an output of each actual cell to determine said Ctot value for said actual cell.

18. The method of claim 17 wherein step (e1) further comprises the step of integrating said current during a time said input signal changes over a predetermined percentage of the voltage difference between logic level voltages used in said simulating.

19. The method of claim 12 wherein step (c) further comprises the following step (c1), step (e) further comprises the following steps (e1) and (e3), and step (g) further comprises the following step (g1):

(c1) simulating each active component within said circuit to produce input current information over a time of said simulation;

(e1) integrating said current information for each active component connected to an input of said one type of said plurality of types of cells over said time of said simulation to produce a component charge value;

(e2) dividing said component charge value by a voltage input to said active component during said simulating to produce a component capacitance for said component;

(e3) summing said component capacitance value for each component in said one type of said plurality of types of cells to produce an input capacitance value for said one type of said plurality of types of cells and adding said input capacitance to a corresponding one of said set of parameters; and (g1) summing input capacitance values for output cells connected to an output of each actual cell to determine said Ctot value for said actual cell.

20. The method of claim 19 wherein step (e1) further comprises the step of integrating said current during a time said input signal changes over a predetermined percentage of the voltage difference between logic level voltages used in said simulating.

21. The method of claim 12 wherein step (e) further comprises the step of reducing said set of parameters using the method of least squares.

22. The method of claim 12 wherein step (g) further comprises the step of:

(g1) when a plurality of actual cells are driving a same output in parallel, dividing the value of Ctot for each of said plurality of actual cells by the number of actual cells driving said same output.

23. The method of claim 12, wherein step (e) further comprises the following step:

(e1) when said type of said plurality of types of cells is a transfer gate, reducing said set of parameters to an input capacitance equation for each one type of said plurality of types of cells of said electronic circuit wherein said input capacitance equation comprises $$CIeff = Ci + (Cxo + Ctot)/(1 + ((Cxo + Ctot)*R)/TRin)$$

where Ci, Cxo and R are constants determined by said reducing said set of parameters, Ctot is a capacitance value for a load connected to an output of said one type of said plurality of types of cells, TRin is an input transition time of a signal connected to an input of said one type of said plurality of types of cells, / represents division, and * represents multiplication.

24. A computer implemented method for determining delay of a signal through an electronic circuit, said computer implemented method comprising the steps of:

(a) accepting a plurality of input signal transition time values and output capacitance load values from a user of the method;

(b) combining said plurality of input signal transition time values and output capacitance load values to produce a plurality of sets of parameters, one set of parameters for each combination of input signal transition time value and output capacitance load value;

(c) for each combination of types of cells of a plurality of types of cells used within said electronic circuit, simulating a circuit of said combination once for each set of parameters, wherein each said simulation produces a set of information indicating a time relationship between input signals and output signals of said combination for each set of parameters;

(d) for each set of information produced in step (c) for each combination, determining a delay between said input signals and output signals at a predefined location within each of said signals, and adding said delay to a corresponding one of said set of parameters;

(e) reducing said set of parameters to a delay equation for each combination of said plurality of types of cells of said electronic circuit wherein said delay equation comprises $$\begin{aligned}\text{Delay} = \ & Rdi + min(RDa1 + TDa1 * TRin, \\ & RDa2 + TDa2 * TRin) + \\ & min(RDb1 + LDb1 * Ctot, \\ & RDb2 + LDb2 * Ctot)\end{aligned}$$

where RDa1, and TDa1 are constants determined by said reducing said set of parameters from a first plane of a first cell of said combination, said first plane of said first cell being defined from a first group of at least three parameters from said set of parameters, RDa2, and TDa2 are constants determined by said reducing said set of parameters from a second plane of a first cell of said combination, said second plane of said first cell being defined from a second group of at least three parameters from said set of parameters, RDb1, and TDb1 are constants determined by said reducing said set of parameters from a first plane of a last cell of said combination, said first plane of said last cell being defined from a first group of at least three parameters from said set of parameters, RDb2, and TDb2 are constants determined by said reducing said set of parameters from a second plane of said last cell of said combination, said second plane of said last cell being defined from a second group of at least three parameters from said set of parameters, RDi is a constant determined by all cells between said first cell and said last cell, Ctot is a capacitance value for a load connected to an output of said one type of said plurality of types of cells, TRin is an input transition time of a signal connected to an input of said one type of said plurality of types of cells, * represents multiplication, and min represents taking the minimum of RD1+LD1*Ctot+TD1*TRin and RD2+LD2*Ctot+TD2*TRin;

(f) inputting an actual circuit description of said electronic circuit wherein said actual circuit description defines connections between actual cells to produce said electronic circuit, wherein said actual cells are selected from said plurality of types of cells;

(g) applying said delay equations to said actual cells of said actual circuit description to determine said delay of said signal through said electronic circuit.

25. The method of claim 24 wherein defining said first and second planes for a cell in step (e) comprises the steps of:

(e1) for each set of information produced in step (c) for each one type of cell, determining an output signal transition time value between predefined locations within an output signal, and adding said output signal transition time value to a corresponding one of said set of parameters;

(e2) for each set of information produced in step (e1), dividing said output signal transition time value by said input signal transition time value to produce a transition time ratio;

(e3) sorting records of said set of information in order by said transition time ratio to produce a sorted set of information;

(e4) setting a value for a variable I to 3;

(e5) selecting records one through I from said sorted set of information as a first group and selecting records I+1 through a last element from said sorted set of information as a second group;

(e6) using said first group of records from said sorted set of information and said second group of records from said sorted set to form a pair of planes;

(e7) measuring a standard deviation value of a standard deviation each of said pair of planes from said records and storing said standard deviation value in a corresponding one of said sorted set of information;

(e8) repeating steps (e5) through (e7) while increasing I by one until I equals a number of records in said sorted set of information minus 3;

(e9) selecting a pair of planes from said sorted set having a lowest standard deviation value.

26. The method of claim 24 wherein step (d) further comprises determining said delay at a predefined location half way between a low logic level and a high logic level voltage.

27. The method of claim 24, wherein step (e) further comprises the following step (e1), and wherein step (g) further comprises the following step (g1):

(e1) reducing said set of parameters to an output transition time equation for each one type of said plurality of types of cells of said electronic circuit wherein said output transition time equation comprises $$TRout = RT + LT*Ctot + TT*TRin$$

where RT, LT, and TT are constants determined by said reducing said set of parameters, Ctot is a capacitance value for a load connected to an output of said one type of said plurality of types of cells, TRin is an input transition time of a signal connected to an input of said one type of said plurality of types of cells, and * represents multiplication;

(g1) using an output signal transition time of a first cell as an input transition time of a cell connected to an output of said first cell.

28. The method of claim 27 wherein step (g1) further comprises the step of performing all calculations for said actual cells four times before applying said delay equation to determine said signal delay.

29. The method of claim 24 wherein step (c) further comprises the following step (c1), step (e) further comprises the following steps (e1) and (e2), and step (g) further comprises the following step (g1):

(c1) simulating said circuit to produce input current information over a time of said simulation;

(e1) integrating said current information over said time of said simulation to produce a charge value;

(e2) dividing said charge value by a voltage input to said cell during said simulating to produce an input capacitance for said one type of said plurality of types of cells and adding said input capacitance to a corresponding one of said set of parameters; and (g1) summing input capacitance values for output cells connected to an output of each actual cell to determine said Ctot value for said actual cell.

30. The method of claim 29 wherein step (e1) further comprises the step of integrating said current during a time said input signal changes over a predetermined percentage of the voltage difference between logic level voltages used in said simulating.

31. The method of claim 30 wherein step (e1) further comprises the step of integrating said current during a time said input signal changes over a predetermined percentage of the voltage difference between logic level voltages used in said simulating.

32. The method of claim 24 wherein step (c) further comprises the following step (c1), step (e) further comprises the following steps (e1) and (e3), and step (g) further comprises the following step (g1):

(c1) simulating each active component within said circuit to produce input current information over a time of said simulation;

(e1) integrating said current information for each active component connected to an input of said one type of said plurality of types of cells over said time of said simulation to produce a component charge value;

(e2) dividing said component charge value by a voltage input to said active component during said simulating to produce a component capacitance for said component;

(e3) summing said component capacitance value for each component in said one type of said plurality of types of cells to produce an input capacitance value for said one type of said plurality of types of cells and adding said input capacitance to a corresponding one of said set of parameters; and (g1) summing input capacitance values for output cells connected to an output of each actual cell to determine said Ctot value for said actual cell.

33. The method of claim 24 wherein step (e) further comprises the step of reducing said set of parameters using the method of least squares.

34. The method of claim 24 wherein step (g) further comprises the step of:

(g1) when a plurality of actual cells are driving a same output in parallel, dividing the value of Ctot for each of said plurality of actual cells by the number of actual cells driving said same output.

35. The method of claim 24, wherein step (e) further comprises the following step:
   (e1) when said type of said plurality of types of cells is a transfer gate, reducing said set of parameters to an input capacitance equation for each one type of said plurality of types of cells of said electronic circuit wherein said input capacitance equation comprises $$CIeff = Ci + (Cxo + Ctot)/(1 + ((Cxo + Ctot)*R)/TRin)$$

where Ci, Cxo and R are constants determined by said reducing said set of parameters, Ctot is a capacitance value for a load connected to an output of said one type of said plurality of types of cells, TRin is an input transition time of a signal connected to an input of said one type of said plurality of types of cells, / represents division, and * represents multiplication.

36. A computer implemented method for determining delay of a signal through an electronic circuit, said computer implemented method comprising the steps of:
   (a) accepting a plurality of input signal transition time values and output capacitance load values from a user of the method;
   (b) combining said plurality of input signal transition time values and output capacitance load values to produce a plurality of sets of parameters, one set of parameters for each combination of input signal transition time value and output capacitance load value;
   (c) for each one type of a plurality of types of cells used within said electronic circuit, simulating a circuit of said one type of cell once for each set of parameters, wherein each said simulation produces a set of information indicating a time relationship between input signals and output signals of said one type of cell for each set of parameters;
   (d) for each set of information produced in step (c) for each one type of cell, determining a delay between said input signals and output signals at a predefined location within each of said signals, and adding said delay to a corresponding one of said set of parameters;
   (e) reducing said set of parameters to a three coefficient delay equation for each one type of said plurality of types of cells of said electronic circuit;
   (f) combining a constant term of said three coefficient delay equation into a coefficient of an internal capacitance term of said three coefficient delay equation to produce a two coefficient delay equation for each one type of said plurality of types of cells of said electronic circuit, wherein said combining determines a new coefficient of said internal capacitance that minimizes delay offset;
   (g) inputting an actual circuit description of said electronic circuit wherein said actual circuit description defines connections between actual cells to produce said electronic circuit, wherein said actual cells are selected from said plurality of types of cells; and
   (h) applying said two coefficient delay equations to said actual cells of said actual circuit description to determine said delay of said signal through said electronic circuit.

37. A computer implemented method for determining a delay through an electronic circuit, said computer implemented method comprising the steps of:
   (a) accepting an input signal transition time value and output capacitance load value from a user of the method;
   (b) for each one type of a plurality of types of cells used within said electronic circuit, simulating a circuit of said one type of cell using said input signal transition time and said output capacitance value, comprising simulating each active component within said circuit to produce input current information for said circuit over a time of said simulation;
   (c) for said input current information produced in step (b) for each one type of cell, integrating said current information for said one type of cell over said time of said simulation to produce a charge value for an input to said one type of cell;
   (d) for each charge value produced in step (c) for each one type of cell, dividing said charge value by a voltage input to said one type of cell during said simulation to produce a cell input capacitance for said one type of cell;
   (e) inputting an actual circuit description of said electronic circuit wherein said actual circuit description defines connections between actual cells to produce said electronic circuit, wherein said actual cells are selected from said plurality of types of cells;
   (f) applying said cell input capacitance for each selected cell to a predetermined delay equation for said cell of said actual circuit description to determine a delay of said signal through said electronic circuit.

38. The method of claim 37 wherein step (c) further comprises the step of integrating said current during a time said input signal changes over a predetermined percentage of the voltage difference between logic level voltages used in said simulating.

39. The method of claim 37 wherein step (c) further comprises the step of integrating said current during a time said input signal changes over an entire voltage difference between logic level voltages used in said simulating.

* * * * *